(12) United States Patent
Ayazi et al.

(10) Patent No.: US 7,023,065 B2
(45) Date of Patent: Apr. 4, 2006

(54) CAPACITIVE RESONATORS AND METHODS OF FABRICATION

(75) Inventors: Farrokh Ayazi, Atlanta, GA (US); Siavash Pourkamali Anaraki, Tehran (IR)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 10/632,176

(22) Filed: Jul. 31, 2003

(65) Prior Publication Data

US 2004/0065940 A1    Apr. 8, 2004

Related U.S. Application Data

(60) Provisional application No. 60/401,723, filed on Aug. 7, 2002, provisional application No. 60/469,532, filed on May 9, 2003.

(51) Int. Cl.
*H01L 27/14*    (2006.01)

(52) U.S. Cl. ............ 257/414; 257/415; 257/416; 257/417; 438/22; 438/50; 438/52; 438/53

(58) Field of Classification Search ........ 257/414–417, 257/622; 438/22, 50, 52, 53; 338/186–192; 307/110
See application file for complete search history.

(56) References Cited

U.S. PATENT DOCUMENTS

| | | | |
|---|---|---|---|
| 3,513,356 A | 5/1970 | Newell | |
| 3,634,787 A | 1/1972 | Newell | 333/72 |
| 5,162,691 A | 11/1992 | Mariani et al. | 310/321 |
| 5,426,070 A | 6/1995 | Shaw et al. | 437/203 |
| 5,491,604 A | 2/1996 | Nguyen et al. | 361/278 |
| 5,587,620 A | 12/1996 | Ruby et al. | 310/346 |
| 5,589,082 A | 12/1996 | Lin et al. | 216/2 |
| 5,663,505 A | 9/1997 | Nakamura | 73/702 |
| 5,719,073 A | 2/1998 | Shaw et al. | 437/228 |
| 5,846,849 A | 12/1998 | Shaw et al. | 438/52 |
| 5,847,454 A | 12/1998 | Shaw et al. | 257/734 |
| 5,873,153 A | 2/1999 | Ruby et al. | 29/25.35 |
| 5,884,378 A | 3/1999 | Dydyk | 29/25.35 |
| 5,894,647 A | 4/1999 | Lakin | 29/25.35 |
| 5,914,801 A | 6/1999 | Dhuler et al. | 359/230 |
| 5,976,994 A | 11/1999 | Nguyen et al. | 438/795 |
| 5,998,906 A | 12/1999 | Jerman et al. | 310/309 |
| 6,000,280 A | 12/1999 | Miller et al. | 73/105 |
| 6,051,866 A | 4/2000 | Shaw et al. | 257/417 |
| 6,060,818 A | 5/2000 | Ruby et al. | 310/363 |
| 6,067,858 A | 5/2000 | Clark et al. | 73/504.16 |
| 6,087,747 A | 7/2000 | Dhuler et al. | 310/90 |
| 6,121,552 A | 9/2000 | Brosnihan et al. | 174/253 |
| 6,134,042 A | 10/2000 | Dhuler et al. | 359/224 |

(Continued)

OTHER PUBLICATIONS

Farrokh Ayazi et al. "High Aspect-Ratio Combined Poly and Single-Crystal Silicon (HARPSS) MEMS Technology", J. of Microelectromechanical Systems, vol. 9, No. 3, Sep. 2000.*

(Continued)

*Primary Examiner*—Donghee Kang
(74) *Attorney, Agent, or Firm*—Thomas, Kayden, Horstemeyer & Risley, LLP

(57) ABSTRACT

A micro-electro-mechanical system (MEMS) capacitive resonator and methods for manufacturing the same are invented and disclosed. In one embodiment, a method comprises forming trenches in a substrate, conformally coating the substrate with an oxide, filling the coated trenches with polysilicon, patterning the polysilicon, releasing a resonating structure derived from the substrate, and removing the conformally coated oxide.

35 Claims, 12 Drawing Sheets

U.S. PATENT DOCUMENTS

| | | | |
|---|---|---|---|
| 6,215,375 B1 | 4/2001 | Larson, III et al. | 333/187 |
| 6,236,281 B1 | 5/2001 | Nguyen et al. | 331/154 |
| 6,238,946 B1 | 5/2001 | Ziegler | 438/50 |
| 6,239,536 B1 | 5/2001 | Lakin | 310/364 |
| 6,256,134 B1 | 7/2001 | Dhuler et al. | 359/212 |
| 6,275,122 B1 | 8/2001 | Speidell et al. | 333/186 |
| 6,275,320 B1 | 8/2001 | Dhuler et al. | 359/237 |
| 6,291,931 B1 | 9/2001 | Lakin | 310/364 |
| 6,296,779 B1 | 10/2001 | Clark et al. | 216/66 |
| 6,348,846 B1 | 2/2002 | von Gutfeld et al. | 333/201 |
| 6,373,682 B1 | 4/2002 | Goodwin-Johansson | 361/278 |
| 6,377,438 B1 | 4/2002 | Deane et al. | 361/278 |
| 6,391,674 B1 | 5/2002 | Ziegler | 438/52 |
| 6,413,793 B1 * | 7/2002 | Lin et al. | 438/50 |
| 6,428,713 B1 | 8/2002 | Christenson et al. | 216/2 |
| 6,429,755 B1 | 8/2002 | Speidell et al. | 333/197 |
| 6,433,401 B1 | 8/2002 | Clark et al. | 257/524 |
| 6,480,645 B1 | 11/2002 | Peale et al. | 385/18 |
| 6,485,273 B1 | 11/2002 | Goodwin-Johansson | 417/410.2 |
| 6,495,892 B1 | 12/2002 | Goodman et al. | 257/414 |
| 6,497,141 B1 | 12/2002 | Turner et al. | 73/105 |
| 6,555,201 B1 | 4/2003 | Dhuler et al. | 428/137 |
| 2003/0006468 A1 | 1/2003 | Ma et al. | |

OTHER PUBLICATIONS

No et al., "The HARPSS Process for Fabrication of Nano-Precision Silicon Electromechanical Resonators", IEEE Conf. of Nanotechnology, pp 489-494, Oct. 30, 2001.*

Ayazi, et al.; Piezoelectric On Semiconductor-On-Insulator Microelectromechanical Resonators And Methods Of Fabrication; U.S. Appl. No. 10/631,948; filed Jul. 31, 2003.

Bourgeois, et al.; Design of Resonators for the Determination of the Temperature Coefficients of Elastic Constants of Monocrystalline Silicon; 1997 IEEE International Frequency Control Symposium; Orlando, FL.; pp. 791-799.

Mihailovich, et al.; Dissipation Measurements of Vacuum-Operated Single-Crystal Silicon Microresonators, Sensors and Actuators A 50 (1995); pp. 199-207.

Roszhart, et al.; The Effects of Thermoelastic Internal Friction on the Q of Micromachined Silicon Resonators; IEEE Solid State Sensor and Actuator Workshop, Hilton Head, SC 6/4-7/90 (1990) pp 489-494.

Cleland, et al.; Fabrication of High Frequency Nanometer Scale Mechanical Resonators from Bulk Si Crystals; Condensed Matter Physics, CA Inst. of Tech.; Received Jun. 21, 1996, pp. 2653-2655.

No, et al.; The HARPSS Process for Fabrication of Nano-Precision Silicon Electromechanical Resonators; IEEE Conf. of Nanotechology; Oct. 30, 2001; pp. 489-494.

Water, et al.; "Physical and Structural Properties of ZnO Sputtered Films"; Dept. of EE, National Cheng Kung University; Received May 7, 2001; pp. 67-72.

Bhave, et al.; Poly-Sige: A High-Q Structural Material for Integrated RF Mems; Solid-State Sensor, Actuator and Microsystems Workshop, Hilton Head Island, South Carolina, Jun. 2-6, 2002; pp 34-37.

Hsu, et al.; Q Optimized Lateral Free-Free Beam Micromechanical Resonators; Digest of Technical Papers, The 11th Int. Conf. On Solid-State Sensors & Actuators (Transducers'01), Munich, Germany, Jun. 10-14, 2001, pp. 1110-1113.

Yasumura, et al.; Quality Factors in Micron- and Submicron—Thick Cantilevers; Journal of Microelectromechanical Systems, vol. 9, No. 1, Mar. 2000; pp 117-125.

Peterson, et al.; Resonant Beam Pressure Sensor Fabricated With Silicon Fusion Bonding; 6th Int. Conference on Solid State Sensors and Actuators (Transduces '91), San Francisco, CA; 1991; pp 664-667.

Abdelmoneum, et al.; Stemless Wine-Glass Mode Disk Micromechanical Resonators; IEEE; 2003; pp 698-701.

Piekarski, et al; Surface Micromachined Piezoelectric Resonant Beam Filters; Sensors and Actuators, A 91; 2001; pp 313-320.

Lifshitz, et al.; Thermoelastic Damping In Micro- and Nanomechanical Systems; Physical Review B; vol. 61, No. 8; Feb. 15, 2000; pp 5600-5609.

Srikar, et al.; Thermoelastic Damping In Fine-Grained Polysilicon Flexural Beam Resonators; Journal of Microelectromechanical Systems, vol. 11, No. 5; Oct., 2002; pp 499-504.

Lakin; Thin Film Resonators and Filters; IEEE Ultrasonics Symposium; 1999; pp 895-906.

Ruby, et al.; Ultra-Miniature High-Q Filters and Duplexers Using FBAR Technology; IEEE International Solid-State Circuits Conference; 2001; pp 120-121 & 438.

Clark, et al.; High-Q VHF Micromechanical Contour-Mode Disk Resonators; IEEE; 2000; pp 493-496.

Wang, et al.; VHF Free-Free Beam High-Q Micromechanical Resonators; Journal of Microelectromechanical Systems, vol. 9, No. 3; Sep. 2000; pp 347-360.

Piazza, et al.; Voltage-Tunable Piezoelectrically-Transduced Single-Crystal Silicon Resonators on SOI Substrate; in Proc. IEEE Internatinal Microelectro Mechanical Systems Conference (MEMs '03), Koyoto, Japan, Jan. 2003.

Pourkamali, et al.; A 600kHz Electrically-Coupled MEMs Bandpass Filter; MEMs '03, pp. 702-705.

Pourkamali, et al.; SOI-Based HF and VHF Single-Crystal Silicon Resonators With SUB-100 Nanometer Vertical Capacitive Gaps; Transducers '03, Boston, MA; Jun. 2003.

No, et al.; Single-Crystal Silicon HARPSS Capacitive Resonators With Submicron Gap-Spacing; Solid State Sensors, Actuators and Microsystems Workshop; pp. 281-284, Hilton Head, SC; Jun. 2002.

Amini, et al.; Capacitive Accelerometer; IEEE International Solid-State Circuits Conference; 2000; pp 1-3.

Ho, et al.; Through-Support-Coupled Micromechanical Filter Array; School of Electrical and Computer Engineering; Proc. IEEE International Micro Electro Mechanical Systems Conference (MEMS'04), Maastricht, The Netherlands, Jan. 2004, pp769-772.

Pourkamali, et al.; Fully Single Crystal Silicon Resonators With Deep-Submicron Dry-Etched Transducer Gaps; Proc. IEEE International Micro Electro Mechanical Systems Conference (MEMS '04), The Netherlands, Jan. 2004, pp 813-816.

Pourkamali, et al.; Electrostatically Coupled Micromechanical Beam Filters; Proc. IEEE International Micro Electro Mechanical Systems Conference (MEMS '04), The Netherlands, Jan. 2004, pp. 584-587.

Amini, et al.; A High Resolution, Stictionless, CMOS Compatible SOI Accelerometer with a Low Noise, Low Power, 0.25 μm CMOS Interface; IEEE MEMS'04, Jan. 2004, pp. 572-575.

Humad, et al.; High Frequency Micromechanical Piezo-On-Silicon Block Resonators; IEEE; 2003.

Abdolvand, et al.; Thermoelastic Damping in Trench-Refilled Polysilicon Resonators; IEEE; 2003; pp 324-327.

Sundaresan, et al.; A 7-MHz Process, Temperature and Supply Compensated Clock Oscillator in 0.25μm CMOS; Proc. of International Symposium on Circuits and Systems (ISCAS) 2003, vol. 1, pp. 693-696, May 2003.

No, et al.; Single-Crystal Silicon HARPSS Capacitive Resonators With Submicron Gap-Spacing; Solid-State Sensor, Actuator and Microsystems Workshop, Hilton Head Island, South Carolina, Jun. 2-6, 2002; pp 281-284.

Balaraman, et al.; Low-Cost Low Actuation Voltage Copper RF MEMS Switches; IEEE; 2002; pp 1225-1228.

Dalmia; Design of Inductors in Organic Substrates For 1-3 GHz Wireless Applications; IEEE; 2002; pp 1405-1408.

Dalmia, et al.; High-Q RF Passives on Organic Substrates Using a Low-Cost Low-Temperature Laminate Process; Proc. 2002 Symposium on Design, Test, Integration and Packaging of MEMS/MOEMS (DTIP 2002), Cannes, France, May 2002, pp. 660-669.

Ayazi, et al.; A High Aspect-Ratio Polysilicon Vibrating Ring Gyroscope; Solid-State Sensor and Actuator Workshop, Hilton Head Island, South Carolina, Jun. 4-8, 2002; pp 289-292.

Ayazi, et al.; High Aspect-Ratio Dry-Release Poly-Silicon MEMS Technology for Inertial-Grade Microgyroscopes; IEEE; 2000; pp 304-308.

Ayazi, et al.; Design and Fabrication of A High-Performance Polysilicon Vibrating Ring Gyroscope; IEEE; 1998; pp 621-626.

Selvakumar, et al.; A High Sensitivity Z-Axis Torsional Silicon Accelerometer; The International Electron Devices Meeting; San Francisco, CA; Dec. 8-11, 1996.

Hao, et al.; An Analytical Model for Support Loss in Micromachined Beam Resonators With In-Plane Flexural Vibrations; Sensors and Actuators, A109; 2003; pp 156-164.

Pourkamali, et al.; High-Q Single Crystal Silicon HARPSS Capacitive Beam Resonators With Self-Aligned Sub-100-nm Transduction Gaps; Journal of Microelectromechanical Systems, vol. 12, No. 4; Aug. 2003; pp 487-496.

Ayazi, The HARPSS Process for Fabrication of Precision MEMS Inertial Sensors; Mechatronics 12; 2002; pp 1185-1199.

Ayazi; A HARPSS Spolysilicon Vibrating Ring Gyroscope; Journal of Microelectromechanical Systems; vol. 10, No. 2; Jun. 2001; pp 169-179.

Ayazi, et al.; High Aspect-Ratio Combined Poly and Single-Crystal Silicon (HARPSS) MEMS Technology; Journal of Microelectromechanical Systems; vol. 9, No. 3; Sep. 2000; pp 288-294.

Ayazi, et al.; High Aspect-Ratio Polysilicon Micromachining Technology; Sensors and Actuators; 87; 2002; pp 46-51.

Yazdi, et al.; Micromachined Inertial Sensors; Proceedings of the IEEE; vol. 86, No. 8; Aug. 1998; pp 1640-1659.

PCT International Search Report.

\* cited by examiner

CAPACITIVE RESONATORS AND METHODS OF FABRICATION

CROSS-REFERENCE TO RELATED APPLICATION

This application claims the benefit of U.S. Provisional Application No. 60/401,723, filed Aug. 7, 2002, and U.S. Provisional Application No. 60/469,532, filed May 9, 2003, both of which are entirely incorporated herein by reference.

This application is related to copending U.S. Utility patent application having Ser. No. 10/631,948, filed on the same date.

STATEMENT REGARDING FEDERALLY SPONSORED RESEARCH OR DEVELOPMENT

The U.S. government has a paid-up license in this invention and the right in limited circumstances to require the patent owner to license others on reasonable terms as provided for by the terms of Contract No. DAAH01-01-1-R004 awarded by the U.S. Army.

TECHNICAL FIELD

The present invention is generally related to MEMS (micro-electro-mechanical systems) technology, and, more particularly, is related to capacitive resonators and methods of fabricating the same.

BACKGROUND OF THE INVENTION

Micro-electro-mechanical (MEMS) resonators are a potential candidate to replace current off-chip frequency selective mechanical components such as crystal, ceramic and SAW (Surface Acoustic Wave) devices in wireless communication systems. High quality factors, small size and compatibility with integrated circuit (IC) integration are some of the advantages silicon MEMS capacitive resonators provide over their bulk-component counterparts. Extension of the frequency range of capacitive MEMS resonators into the giga-Hertz (GHz) range requires process technologies that can yield 10–100 nanometer capacitive gap spacings disposed between a high quality factor (Q) resonating structure and corresponding drive and sense electrodes. Quality factor can generally be described as a measure of energy stored in a system divided by the energy dissipated in the system. Quality factor can be characterized in terms of frequency response of a resonator, such as the ratio of the center frequency (f0) to the 3-dB (decibel) bandwidth of the resonator device.

A number of different polysilicon and single crystalline silicon resonators are known to those of ordinary skill in the art. For example, polysilicon capacitive resonators with submicron gap spacing having metal electrodes are known, but typically experience thermal mismatch. Furthermore, the out-of-plane thickness of such resonators is limited by the deposition process and cannot be increased arbitrarily to improve the electromechanical coupling coefficient. Single crystal silicon (SCS) is a more attractive structural material for microresonators compared to polysilicon due to its inherent high mechanical quality factor, stress-free nature, and independence from various process parameters. However, SCS resonators developed in the past had either complex non-capacitive sense and drive mechanisms, large capacitive gaps, or low quality factors. Such pitfalls may compromise design flexibility and limit the high frequency applications of the microresonators.

Thus, a need exists in the industry to address the aforementioned and/or other deficiencies and/or inadequacies.

SUMMARY OF THE INVENTION

Embodiments of the present invention provide MEMS capacitive resonators and methods for fabricating the same.

The present invention can be viewed as providing methods for fabricating a MEMS capacitive resonator. In this regard, one embodiment of such a method, among others, can be broadly summarized by the following steps: forming trenches in a substrate; conformally coating the substrate with an oxide; filling the coated trenches with polysilicon; patterning the polysilicon; releasing a resonating structure derived from the substrate; and removing the conformally coated oxide.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENTS

Figure 1:
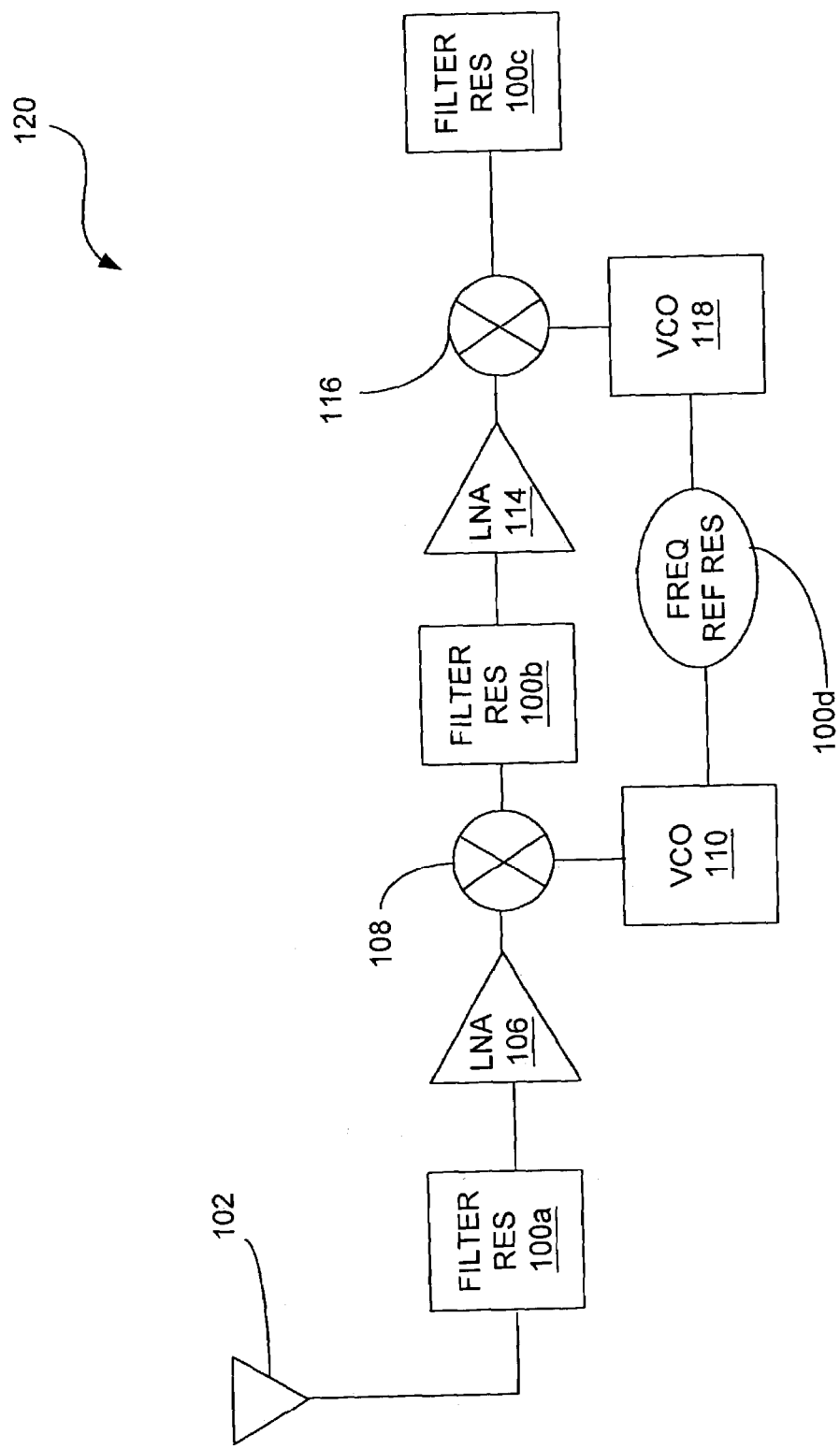
FIG. 1 is a schematic diagram that illustrates one exemplar implementation for the embodiments of the invention.

Embodiments of capacitive resonators and methods for fabricating the same are disclosed. In particular, the implementation of high-Q (Quality Factor) semiconductor material resonators with submicron gap spacing is enabled using what will be referred to herein as capacitive resonator fabrication methods, or CRF methods. The quality factor (Q) can generally be described as a measure of energy stored in a system divided by the energy dissipated in the system. Q can be characterized in terms of frequency response of a resonator, such as the ratio of the center frequency ($f_0$) to the 3-dB (decibel) bandwidth of the resonator device. The embodiments of the invention include substantially all semiconductor materials for the resonating element, such as germanium, silicon, among others. Further, the embodiments of the invention include substantially all semiconductor materials in a variety of crystal alignments or configurations, including single crystal structures, polycrystalline structures, amorphous structures, among others. The CRF methods of the preferred embodiments are based, in part, on the well-known HARPSS (high aspect ratio combined poly and single crystal silicon) process.

One challenge to the implementation of on-chip bandpass filters and frequency references for use in wireless communication systems is the fabrication of micro-electromechanical resonators having both high resonance frequency response characteristics (e.g., ultra-high-frequency, or UHF, of 0.3–3 GHz) and a high Q (10,000–100,000). Some semiconductor materials, such as single crystal silicon (SCS), when used as the resonating structure of the preferred embodiments is an excellent choice of material for the resonating structure due in part to its inherently high mechanical quality factor, superior mechanical stability (stress-free or substantially stress-free), and/or compatibility with CMOS (complementary metal oxide semiconductor) integrated circuit (IC) fabrication processes. The preferred embodiments also include ultra-thin capacitive gaps in the range of 1000 nanometers (nm) to less than 90 nm. The ultra-thin capacitive gaps are desirable to (a) electrostatically actuate ultra-stiff UHF micromechanical resonators and (b) capacitively sense the extremely small vibrations of such structures. MEMS (micro-electro-mechanical systems) capacitive resonators can be as small as 20 microns in diameter, with a capacitance measured in femtofarads. Since the area of a MEMS capacitor is small, decreasing the gap results in an increase in capacitance, providing for stronger electromechanical coupling.

In one embodiment, the CRF methods provide for a semiconductor material such as SCS as the resonating structure with trench-refilled polysilicon electrodes, hence yielding an all-silicon microresonator with excellent temperature stability. These methods are referred to herein as silicon-only CRF methods. For simplicity in discussion, silicon-only embodiments will be described, with the understanding that other semiconductor material, for example germanium, can be used for the resonating structure.

In other embodiments, the CRF methods provide a SCS resonating element that is derived from a semiconductor-on-insulator (SOI) substrate. The use of a SOI substrate provides electrical isolation between the body of individual SCS resonators in an array implementation (e.g., for filter synthesis). These methods are referred to herein as SOI-based CRF methods.

Using a SOI substrate further enables nano-precision fabrication of "ultra-stiff" semiconductor resonators with height-to-width ratios of less than one (1) (e.g., disks) for high frequency operation (e.g., very high frequency (VHF) and UHF). In contrast, near perfect dimensional definition of such devices on regular silicon substrates is difficult to implement if not impossible due to a substrate-release undercut at the bottom, as described below.

Also, the use of a SOI substrate eliminates an isotropic semiconductor material (e.g., silicon)-etching step needed to undercut the silicon-only resonators, which can limit the minimum achievable gap size. By using SOI-based CRF methods, the capacitive gaps can be reduced to their true or nearly true physical limits.

The capacitive gap is defined by a sacrificial oxide layer, which can be potentially reduced to the tens of nanometer range in thickness using the silicon-only CRF method, and experimentally found to be reduced to sub-one hundred nanometer capacitive gaps using SOI-based CRF methods. Quality factors as high as 67,000, for example, have been measured for clamped-clamped beam SCS resonators.

In the description that follows, exemplar capacitive resonator embodiments are described, followed by a silicon-only CRF method and a SOI-based CRF method of the preferred embodiments. Finally, a discussion of performance characteristics of such devices is disclosed herein.

The preferred embodiments of the invention may, however, be embodied in many different forms and should not be construed as limited to the embodiments set forth herein; rather, these embodiments are provided so that this disclosure will be thorough and complete, and will fully convey the scope of the invention to those having ordinary skill in the art. For example, although the embodiments of the invention can be used with substantially any semiconductor substrate material, the preferred embodiments of the invention will be described using an SCS resonating element and a polysilicon electrode material with the understanding that other semiconductor materials in different crystal alignments or structures for the resonating element are also included within the scope of the invention.

FIG. 1 is a schematic diagram that illustrates one exemplar implementation for the embodiments of the invention. Select receiver components of a communication device 120 are shown, with the understanding that transmitter components can also benefit from the embodiments of the invention. The communication device 120 can include a portable transceiver, such as a cellular phone, among other devices. The communication device 120 includes an antenna 102, resonator devices 100a–100c configured as frequency selective filters, low-noise amplifiers 106 and 114, mixers 108 and 116, voltage-controlled oscillators 110 and 118, and a frequency reference resonator device 100d. All components shown except for resonator devices 100a–100d are known, and thus further explanation is omitted for clarity. The use of resonators 100a–100d can result in a reduction in the number of components in the communication device 120. Resonators 100a–100d are very selective at high frequencies, thus substantially obviating the need for pre-amplifier selection and other frequency transformation and/or amplification devices that operate to provide signal processing at frequencies that current devices most efficiently operate under. The resonator devices of the preferred embodiments possess high quality factors at high frequencies, enabling frequency selection with substantially fewer components.

Figure 2A:
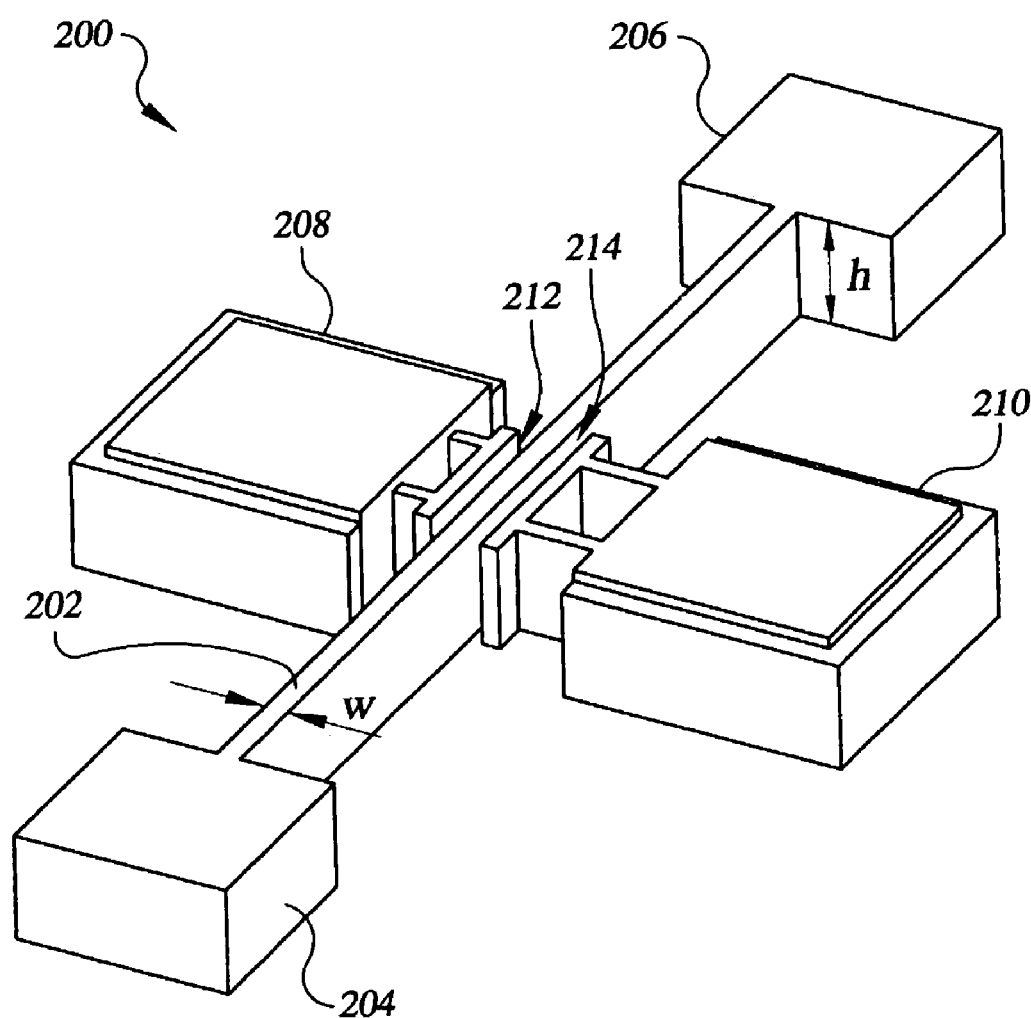
FIG. 2A is a schematic diagram of a capacitive resonator embodiment configured as an in-plane clamped-clamped beam resonator.

FIG. 2A is a schematic diagram of a capacitive resonator embodiment configured as an in-plane clamped-clamped beam resonator. The clamped-clamped beam resonator 200 includes a SCS beam 202 disposed between two clamped regions 204 and 206. The SCS beam 202 has a defined width ("w") and height ("h"), and functions as the resonating element for the clamped-clamped beam resonator 200. Drive electrode 208 and sense electrode 210 oppose one another, separated from the SCS beam 202 by sub-micron gaps 212 and 214. The electrodes 208 and 210 are preferably comprised of polysilicon. Thus, the clamped-clamped beam resonator 200 is comprised primarily or entirely of silicon.

Figure 2B:
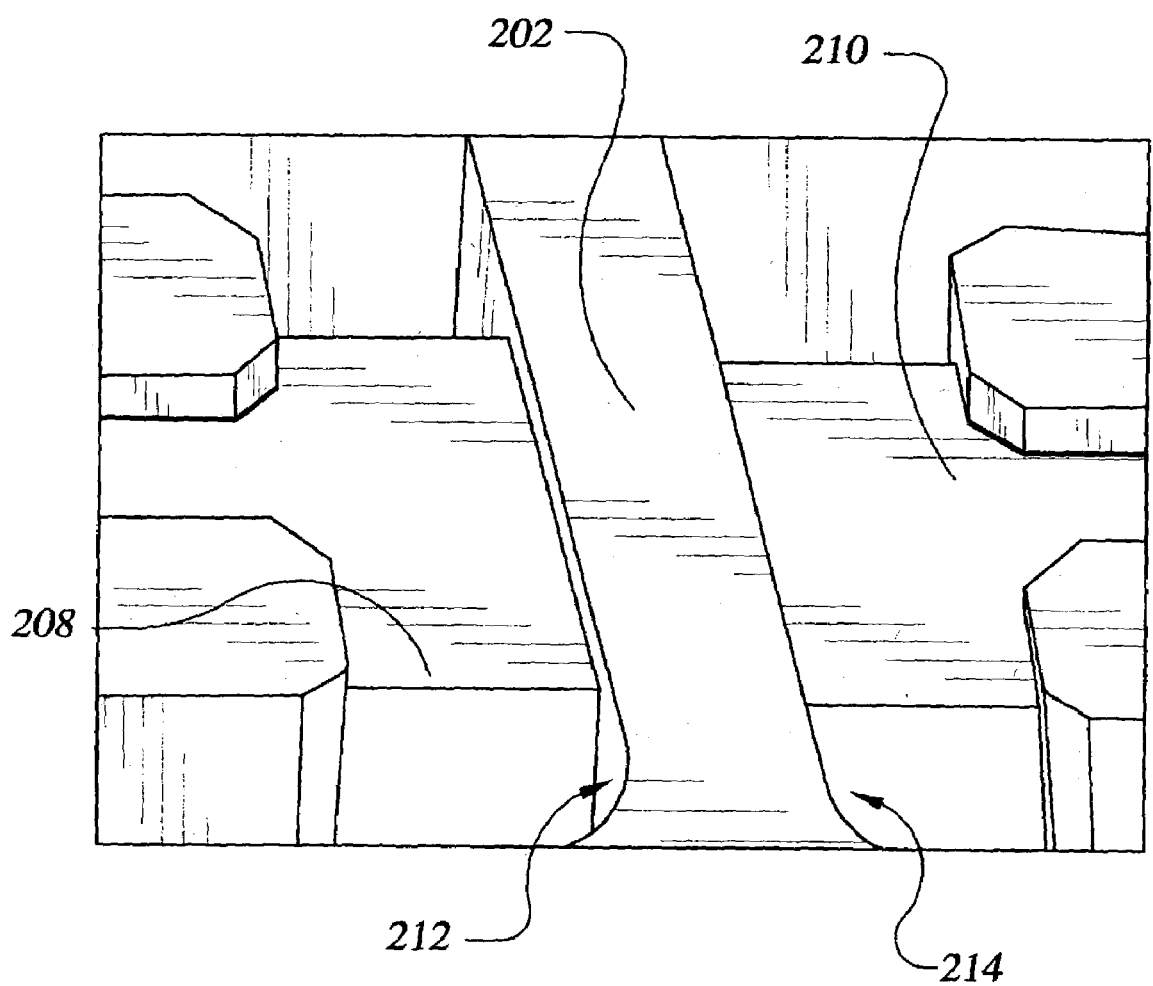
FIG. 2B is a schematic diagram that provides a close-up view of the interface comprising the single crystal silicon (SCS) beam, the electrodes, and the gaps shown in FIG. 2A.

FIG. 2B is a schematic diagram that provides a close-up view of the interface comprising the SCS beam 202, the electrodes 208 and 210, and the gaps 212 and 214 (the latter obscured from view).

Describing the operation of the clamped-clamped beam resonator 200, and with continued reference to FIGS. 2A and 2B, an electrical signal from a particular device (not shown) applied to the drive electrode 208 creates an electrostatic force on the SCS beam 202 and the rest of the clamped-clamped beam resonator 200. When the frequency of the drive signal is equal to or approximately equal to the resonant frequency of the SCS beam 202, the vibrations of the SCS beam 202 are amplified by the quality factor of the clamped-clamped beam resonator 200. The mechanical vibrations are converted back into electrical signals through the change in the spacing of the sub-micron gap 214. That is, a parallel-plate capacitor is formed between the sense electrode 210 and the SCS beam 202 (as well as the SCS beam 202 and the drive electrode 208).

Figure 3A:
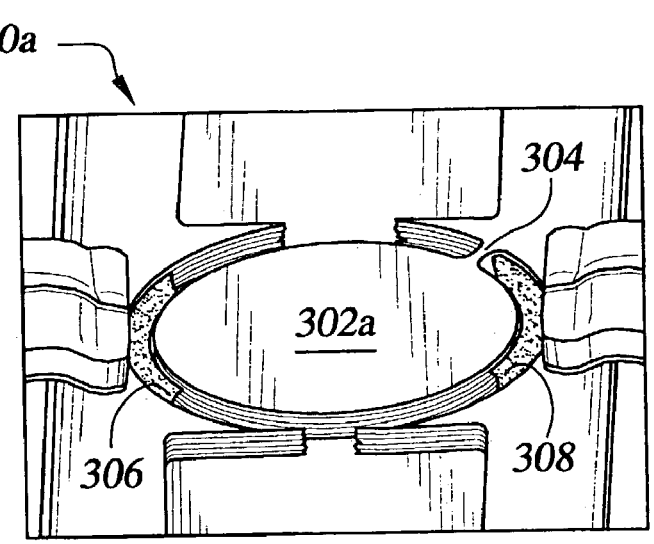
FIG. 3A is a schematic diagram of a second embodiment of a capacitive resonator.

FIG. 3A is a schematic diagram of a second capacitive resonator embodiment. The disk resonator 300a includes a SCS disk 302a supported from the side at one resonance node by a support member 304. The disk resonator 300a also includes drive and sense electrodes 306 and 308, which also are preferably comprised of polysilicon. Note that support from the side of the disk provides for an "elliptical" operation (also referred to as the wine glass mode), as opposed to a "breathing" mode operation. In other words, in a breathing mode, the entire disk would expand and contract substantially uniformly. By supporting from the side, the periphery of the disk is prevented from moving uniformly. However, with an elliptical mode of operation, multiple modes of operation are possible. For example, as the number of "nodes" in the resonance mode shape increases, there is an increase in frequency.

Further, by providing side support, the position of contact support is defined by the same lithographic step that is used to define the disk periphery. In contrast, if the disk was supported at the center, the chances for misalignment (and thus decrease in quality factor due to non-symmetrical cancellation of forces) are greater than side-supported configurations.

Figure 3B:
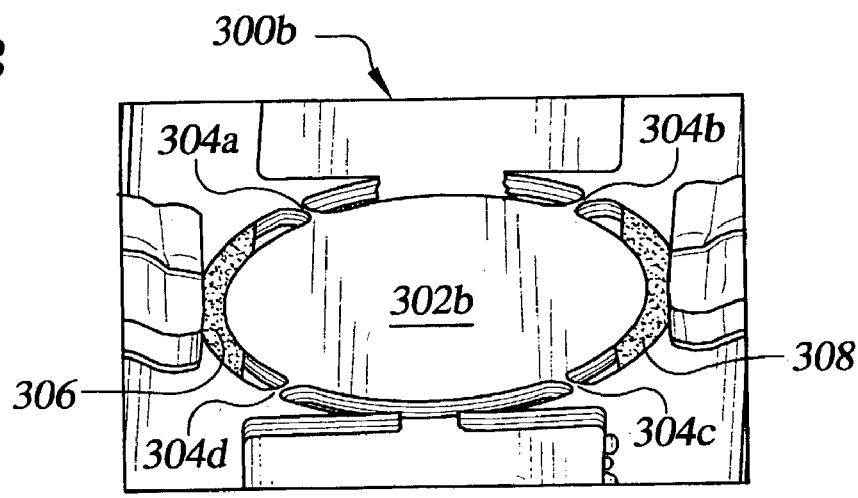
FIG. 3B is a schematic diagram of a third embodiment of a capacitive resonator.

FIG. 3B provides a schematic diagram of a third embodiment of a capacitive resonator. The resonator disk 300b includes SCS disk 302b, the drive and sense electrodes 306 and 308, and is shown supported by four support members 304a–304d. Preferably, the support members 304a–304d are located at the resonance nodes of the resonator disk 300b. The additional support members 304a–304d, as compared to the single support member 304 of the resonator disk 300a of FIG. 3A, provides for increased support stiffness. However, additional support members may decrease the quality factor due in part to an increase in support loss. Note that the preferred embodiments of the invention are not limited to side-supported embodiments.

Figure 3C:
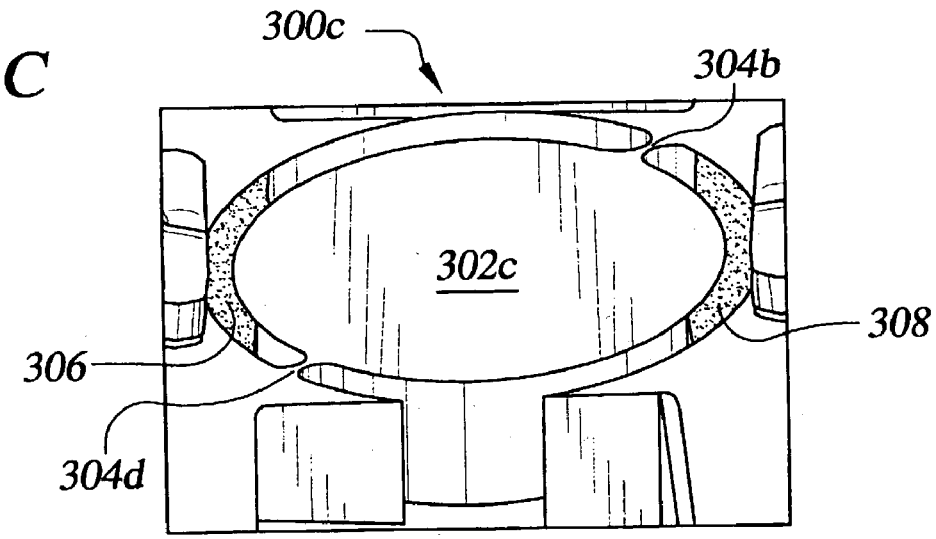
FIG. 3C is a schematic diagram of a fourth embodiment of a capacitive resonator.

FIG. 3C is a schematic diagram of a fourth embodiment of a capacitive resonator. The resonator disk 300c includes a SCS disk 302c, the drive and sense electrodes 306 and 308, and two support members 304b and 304d. The SCS disk 302c has a greater thickness than the other two disk resonator embodiments. Thicknesses of approximately 10–30 microns, or greater, are achievable. The increased thickness enables a smaller equivalent resistance for the resonator through a greater electromechanical coupling as evident by equation 1.

The equivalent electrical output resistance, $R_{io}$, of a capacitive micromechanical resonator is expressed by:

$$R_{io} = \frac{\sqrt{KM}\, d^4}{Q\varepsilon_o^2 L^2 h^2 V_p^2} \propto \frac{d^4}{Q \cdot h} \qquad \text{(Eq. 1)}$$

where K and M are the effective stiffness and mass of the resonator, d is the capacitive gap size, Q is the resonator's quality factor, $V_p$ is the direct current (DC) polarization voltage and L and h are the electrodes' length and height, respectively. From this equation, it is evident that an ultra-thin capacitive gap, a high Q, and/or a large electrode area can be used to reduce the equivalent output resistance of MEMS capacitive resonators to reasonable values. Achieving a smaller output resistance can facilitate the insertion of MEMS capacitive resonators in various high frequency systems.

The high-Q, SCS capacitive resonators of the resonator disk embodiments provide the necessary features to obtain reduced output resistance. First, the capacitive gaps of these resonators are determined in a self-aligned manner by the thickness of the deposited sacrificial oxide layer and can be reduced toward their smallest physical limits (tens of nanometers and less) independent from lithography. In other words, sub-100 nm gaps can be defined without using electron beam lithography, thus obviating the need for time-consuming processes due to the self-aligning nature of the methods. Second, the thickness of the resonators can be increased to a few tens of microns while keeping the capacitive gaps in the nanometer scale, resulting in a low equivalent motional resistance.

Figure 4A:
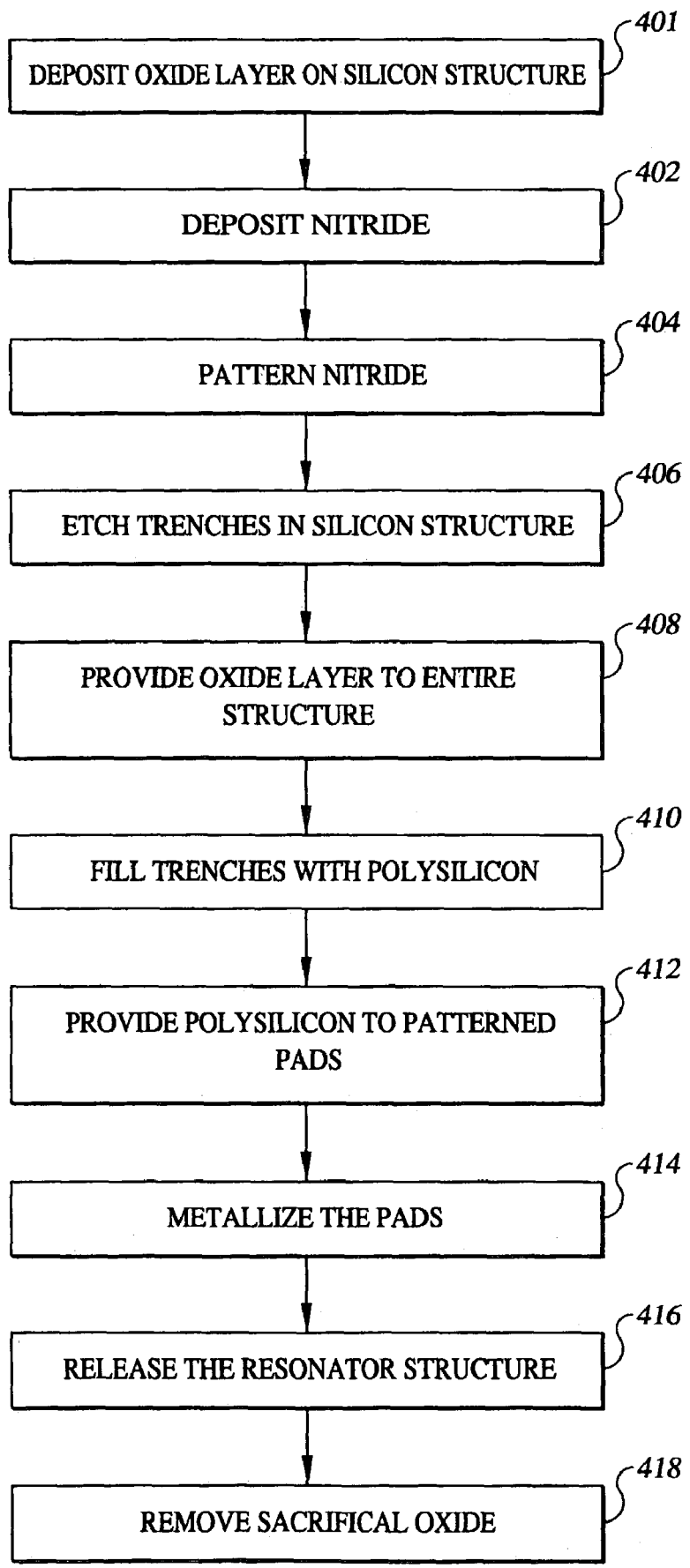
FIG. 4A is a flow diagram that illustrates an embodiment of a silicon-only capacitive resonator fabrication (CRF) method.
Figure 4B:
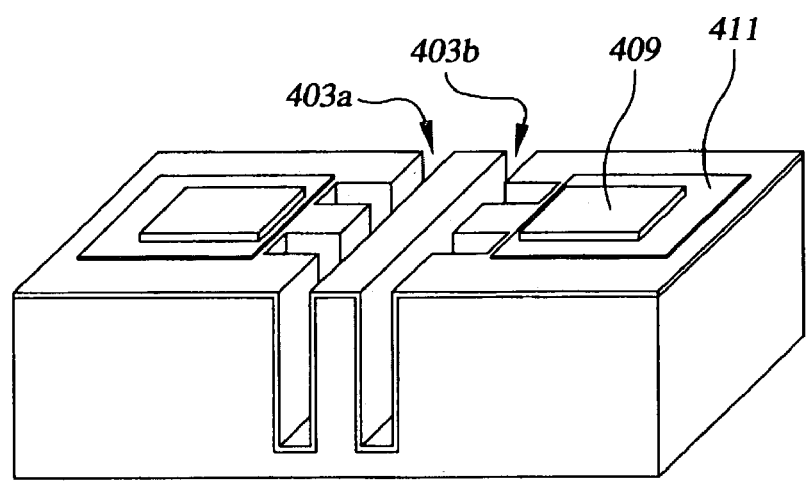
FIGS. 4B–4D are schematic diagrams used in cooperation with the flow diagram of FIG. 4A to illustrate the evolving structure as the method steps are applied.
Figure 4C:
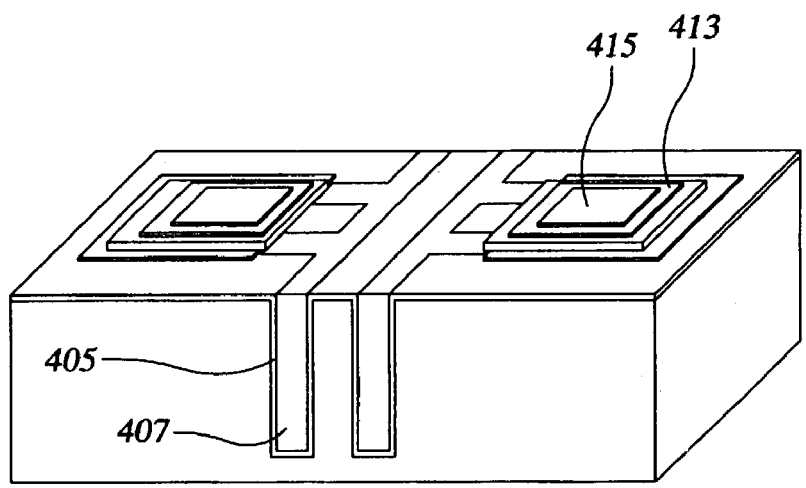
Figure 4D:
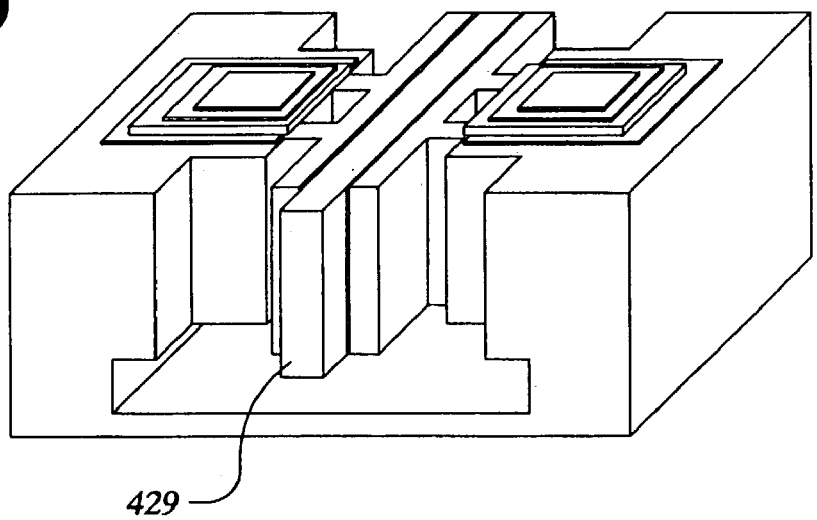

The CRF methods of the preferred embodiments will be described using the resonator beam embodiment shown in FIG. 2A, with the understanding that similar steps are involved when fabricating the resonator disk embodiments, or even block-style embodiments. FIG. 4A is a flow diagram that illustrates a CRF method for fabricating silicon-only resonators of the preferred embodiments (i.e., the silicon-only CRF methods). The silicon-only CRF methods are used to fabricate beam or block style resonators. FIGS. 4B–4D are used in cooperation with the flow diagram of FIG. 4A to illustrate some of the evolving structure as method steps are applied. Any process descriptions or blocks in flow charts should be understood as representing steps in the process. Note that the silicon-only CRF method described below is based on one implementation, and that alternate implementations are included within the scope of the preferred embodiments of the invention such that steps can be omitted, added to, and/or executed out of order from that shown or discussed, as would be understood by those reasonably skilled in the art of the present invention.

Referring to FIGS. 4A and 4B, step 401 includes providing an oxide layer 409 to the substrate. The oxide layer 409 can provide extra isolation and reduce the parasitic capacitance to the substrate. Steps 402 and 404 include depositing and patterning nitride 411 for isolation of pads. The nitride layer 411 serves as an insulating layer, as well as an area to which the polysilicon can be secured. Step 406 includes etching trenches 403a and 403b. The SCS resonating beam is defined by two adjacent high aspect-ratio trenches 403a and 403b that can be approximately 2 to 5 µm wide and up to approximately 100 µm deep. The trenches 403a and 403b are preferably etched in a reactive ion etching process, such as an inductively-coupled plasma (ICP) deep reactive ion etching (DRIE) system using the well-known Bosch process. The height of the trenches 403a and 403b determines the height of the resonator.

Step 408 includes providing an oxide to the entire structure. Preferably, the oxide layer 405 is uniform throughout the structure (and then when removed, provides for a uniform gap spacing). For example, a thin conformal layer of sacrificial LPCVD (low-pressure chemical vapor deposition) high-temperature oxide is deposited. The oxide layer 405 can also be thermally grown.

Referring to FIGS. 4A and 4C, step 410 includes filling trenches with polysilicon 407. The trenches 403a and 403b (FIG. 4B) are preferably filled with doped LPCVD polysilicon 407 to form vertical electrodes. The lateral gap spacing is defined by the thickness of the deposited oxide 405 (from step 408), and thus can be scaled down to the tens of nanometer range. Preferably, the trenches 403a and 403b have a high-aspect ratio (e.g., a ratio greater than 1), since low-aspect ratio trenches (e.g., 100 microns wide and 20 microns deep) can present obstacles to filling of trenches via the deposit of thin films (e.g., 4–5 microns) of polysilicon. However, the scope of the preferred embodiments is not limited to etching high-aspect ratio trenches.

Step 412 includes providing polysilicon 413 to the patterned pads to define the pads, and then metallizing the pads (step 414) with a metal material 415. The polysilicon 413 maintains an electrical connection, as well as serving as a mechanical "anchor."

Referring to FIGS. 4A and 4D, step 416 includes releasing the resonator element (or resonating structure) 429. This step essentially includes two processes. The resonator element 429 is released from the silicon substrate using a dry silicon etch in $SF_6$ plasma, for example, consisting of an anisotropic followed by an isotropic etch to undercut the structures.

Finally, the sacrificial oxide is removed (step 418), for example, using a $HF:H_2O$ (1:1) solution. By removing the oxide, a small gap is created between the electrodes and the vibrating resonator. Thus, the gap is created using a self-aligned process.

In the above process, the trenches 403a and 403b (FIG. 4B) define the boundary of the resonating structure 429 and the polysilicon electrodes. At the end of the process, all the polysilicon inside the trenches 403a and 403b are preferably removed, except for the electrode area. Methods for separating the polysilicon in the electrode area from the areas that only define the boundary of the resonator include opening up regions to remove voids or otherwise remove material (e.g., via etching) not needed.

Figure 5A:
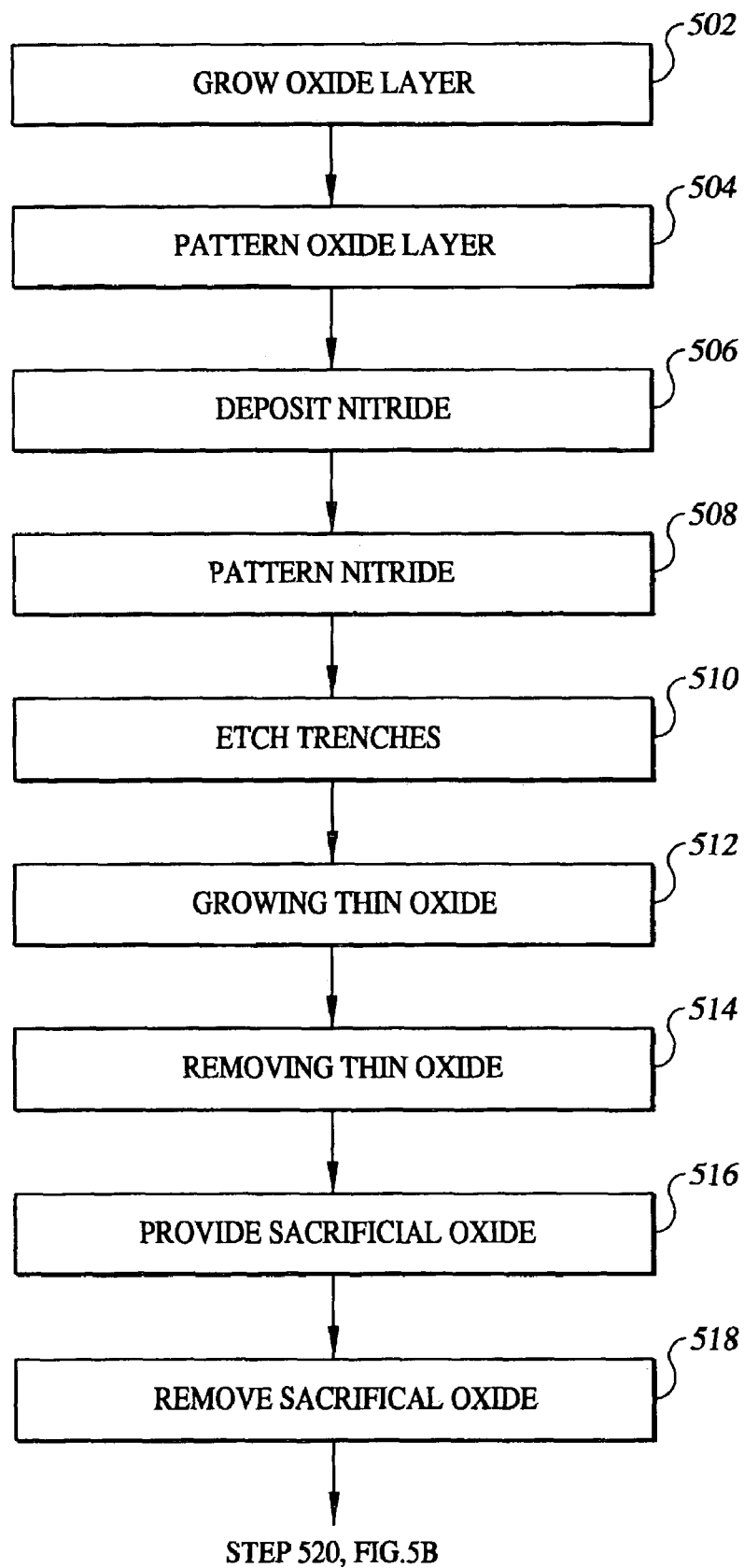
FIGS. 5A–5B are flow diagrams that illustrate an embodiment of a semiconductor-on-insulator (SOI)-based CRF method.
Figure 5B:
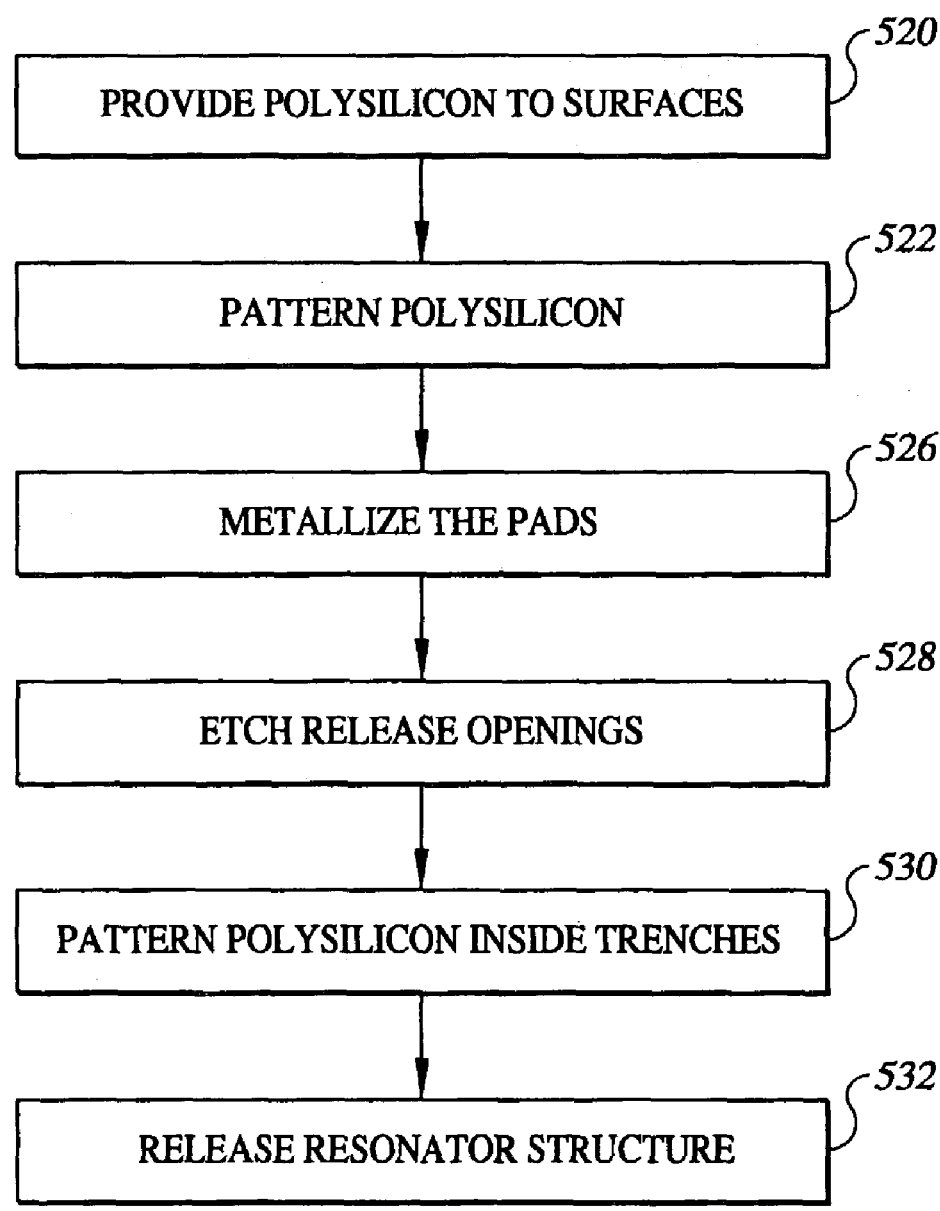

FIGS. 5A–5F are used to illustrate the SOI-based CRF method of the preferred embodiments. The SOI-based CRF methods can be used to fabricate the beam, block, or disk structures. The use of SOI as a substrate results in a scalable structure (e.g., scalable in thickness). For example, thicknesses for SOI embodiments can range from approximately 3 microns to as much as 18 microns or thicker. Further, the ability to use SOI substrates enables greater quality control than deposited methodologies. Also, using SOI substrates enables low-aspect ratio structures with sharply defined boundaries (and smooth surfaces, since etch of bottom surfaces is avoided). FIGS. 5A and 5B are flow diagrams that illustrate the steps of the SOI-based CRF method, and FIGS. 5C–5F are schematic diagrams that are used to show the evolving structure as the steps are implemented. For the sake of clarity and consistency, the SOI-based method is described below using the capacitive resonator beam embodiment.

Figure 5C:
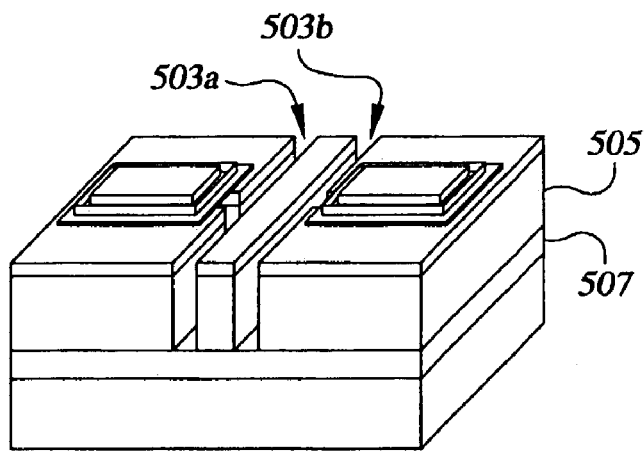
FIGS. 5C–5F are schematic diagrams used in cooperation with the flow diagram of FIGS. 5A–5B to show the evolving structure as the method steps are implemented.

Referring to FIGS. 5A and 5C, step 502 includes growing an oxide layer (e.g. a 1 µm thick oxide layer, not shown) on the SOI substrate. After patterning (e.g., in plasma) (step 504), this oxide layer serves as an insulating layer to provide isolation between the substrate and the input and output wire-bonding pads, and as a mask for a subsequent silicon trench etching step which defines the resonator structure.

Steps 506 and 508 include depositing and patterning nitride for isolation of pads. For example, a thin layer of LPCVD nitride (approximately 3000 Å) is then deposited and patterned on the pads to protect the pad oxide. The nitride layer serves as an insulation layer for the polysilicon to be anchored or secured to. Step 510 includes etching trenches 503a and 503b. As described for the silicon-only CRF method of FIG. 4, the trenches are preferably high-aspect ratio trenches, although not limited to high-aspect ratio embodiments. The SCS resonating elements are defined by etching trenches 503a and 503b in the device layer 505 all or substantially all the way down to the buried oxide layer 507 of the SOI substrate, for example via reactive ion etching.

Figure 5D:
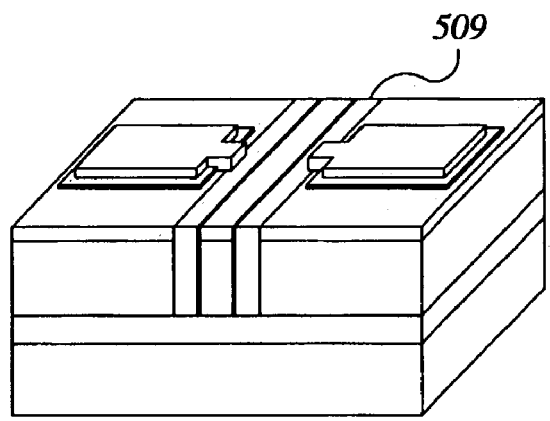

Referring to FIGS. 5A and 5D, steps 512 and 514 include growing and removing a thin oxide. The thin oxide is generally performed at high temperature (e.g., 900 C). These steps enable the reduction of the roughless of the resonator sidewalls and the removal of the surface damage caused by plasma. For example, a thin thermal oxide (approximately 1000–2000 Å) is grown and subsequently removed in BHF (buffered hydro-flouric acid). Step 516 includes providing a sacrificial oxide. For example, a thin conformal layer of LPCVD high-temperature oxide is preferably deposited (approximately less than 100 nm). Step 518 includes removing the sacrificial oxide. For example, the sacrificial oxide can be removed from the surface by a short anisotropic plasma etching, so that the sacrificial oxide remains only on the resonator sidewalls. The lateral gap spacing is defined by the thickness of the deposited oxide layer, and thus can be scaled down to tens of nanometer range.

Step 520 includes providing polysilicon 509 to the surfaces. For example, trenches are filled with doped LPCVD polysilicon 509 to form vertical electrodes. The polysilicon 509 fills the trenches primarily from the sidewalls until the gap between sidewalls is essentially closed. Step 522 includes patterning the deposited polysilicon 509. For example, the deposited polysilicon (approximately 3 µm thick) is patterned on the surface to form the wirebonding pads for the drive and sense electrodes.

Figure 5E:
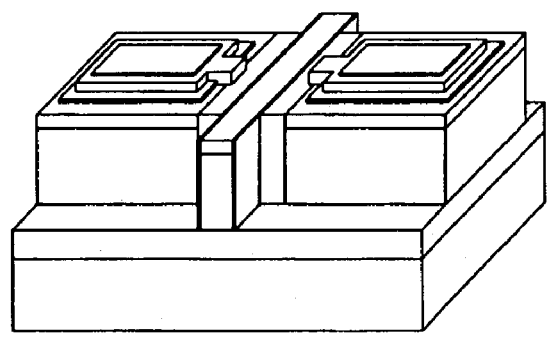

Referring to FIGS. 5A and 5E, step 526 includes metallizing the pads. For example, a thin layer of gold can be deposited on the pads. Step 528 includes etching release openings (not shown). For example, release openings can be etched anisotropically into the silicon all the way down to the oxide layer to facilitate the undercut of the structures in HF. In other words, the oxide between the resonator body and the electrodes provides for freedom of movement. At the same time the polysilicon inside the trenches is patterned (step 530).

The use of the SOI substrate eliminates, substantially or completely, the need for isotropic silicon etching to undercut the structures. In the silicon-only CRF methods of FIG. 4, since the sacrificial oxide layer was used to protect polysilicon electrodes during the undercut of the SCS structures, there can be a limit on the minimum thickness of the sacrificial layer (due to finite selectivity of silicon etchant to oxide). There is no such limitation in this fabrication process.

Figure 5F:
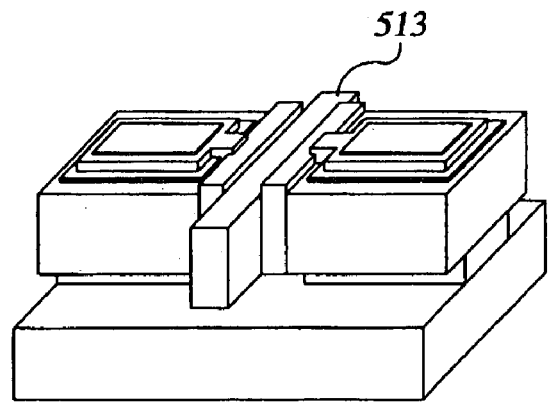

Referring to FIGS. 5B and 5F, step 532 includes releasing the resonator structure 513. For example, the resonator 513 is released from a handle silicon layer (e.g., layer below the oxide layer of the SOI substrate) and their electrodes by dipping the devices in an $HF:H_2O$ solution.

The CRF methods of the preferred embodiments are an enabling technology that provides for a range of performance characteristics for capacitive resonators. The description that follows will focus on performance characteristics for the silicon-only capacitive resonators, in particular capacitive beam resonators fabricated using the silicon-only CRF methods.

Prototypes of the fabricated SCS beam resonators were tested under vacuum in a two-port configuration using a network analyzer. A low-noise JFET source-follower with a gain stage was used to interface with the resonators. The sensing interface circuit was built on a printed circuit board (PCB) using surface mount components and the MEMS resonator chip was mounted on the board and wire-bonded. The PCB was placed in a custom vacuum system, which kept the pressure less than approximately 1 mTorr.

Table 1 below provides a summary of the measured quality factor values for the capacitive beam resonators fabricated using the silicon-only CRF methods of the preferred embodiments. The resonators had fundamental frequencies ranging from approximately 41.5 kHz to 530 kHz, with quality factors ranging from approximately 17,000 to 67,000.

TABLE 1

| W (μm) | L (μm) | $F_0$-$1^{st}$ (kHz) | Q ($1^{st}$ Mode) |
|---|---|---|---|
| 6.5 | 1100 | 41.5 | 67000 |
| 7.5 | 1100 | 47.8 | 61900 |
| 7.5 | 900 | 74.8 | 53600 |
| 7.5 | 700 | 125.5 | 39400 |
| 5.5 | 510 | 164.5 | 60400 |
| 6.5 | 510 | 198.0 | 35000 |
| 7.5 | 510 | 217.0 | 27000 |
| 5.5 | 300 | 489.3 | 21500 |
| 6.5 | 300 | 528.0 | 17000 |

Figure 6A:
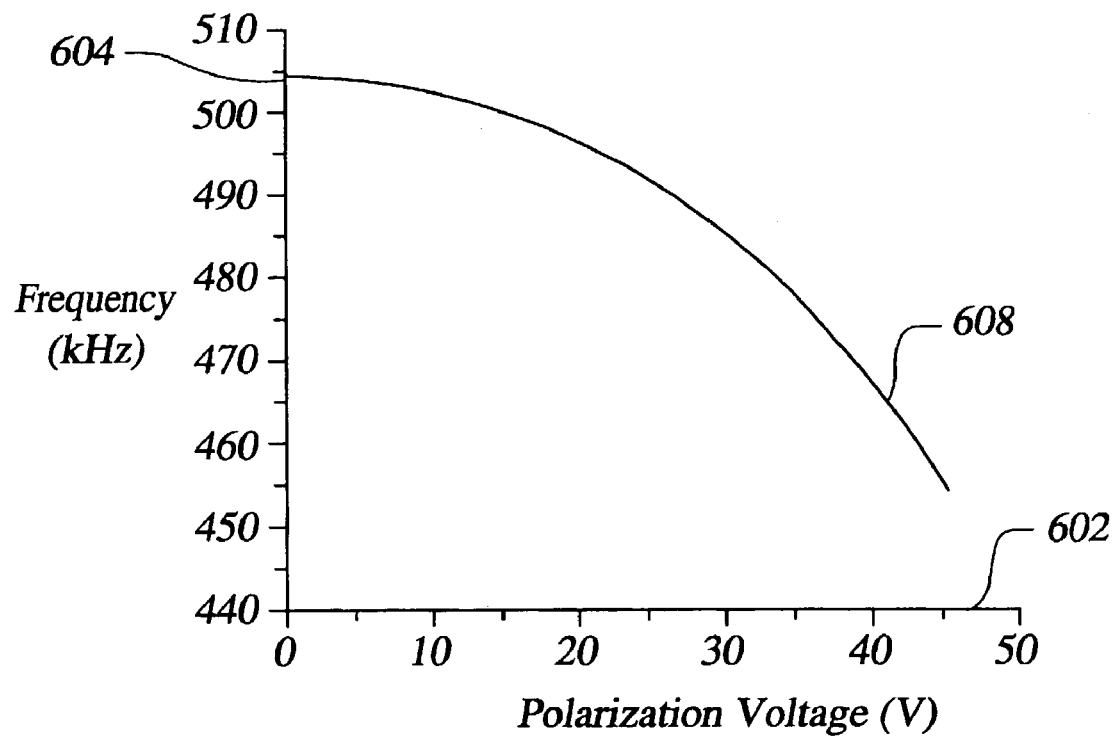
FIG. 6A is a graph that illustrates a plot of resonance frequency versus polarization voltage for a capacitive resonator beam embodiment.

FIG. 6A is a graph that illustrates a plot of resonance frequency versus polarization voltage for a particular capacitive beam embodiment. In other words, FIG. 6A shows the measured frequency tuning characteristics (curve 608) for a 300 μm long, 6.5 μm wide resonator by changing the direct current (DC) polarization voltage (Vp). Axis 602 provides for polarization voltage in volts. Axis 604 provides for frequency response in units of kHz. As noted, the resonance frequency changed from approximately 505 kHz to approximately 450 kHz by changing the polarization voltage by more than 40V (the calculated pull-in voltage was 56V), providing a large electrostatic tuning range (approximately 10%).

Figure 6B:
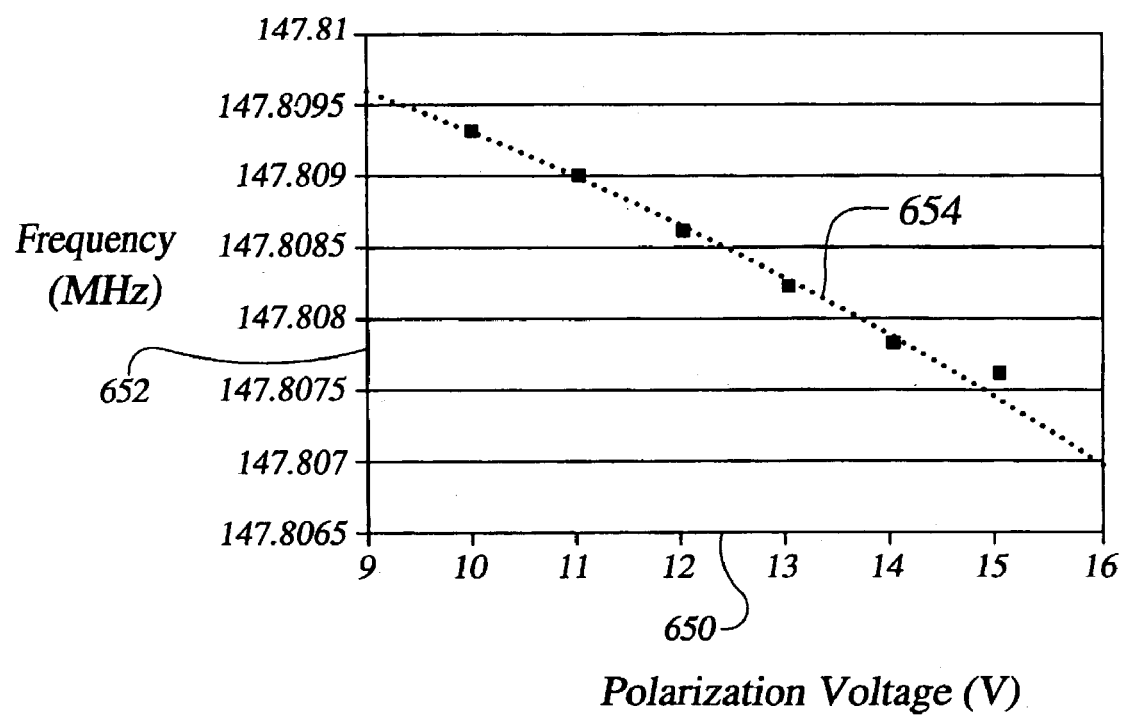
FIG. 6B is a graph that illustrates a measure of tuning performance.

FIG. 6B is a graph that illustrates a measure of tuning performance. In particular, axis 602 provides for polarization voltage in volts, and axis 604 provides for frequency in MHz. When tuning capacitive resonators, a changing polarization voltage is applied to parallel plate actuators (e.g., sense and drive electrodes), resulting in a change in equivalent electrical stiffness. As shown in FIG. 6B, the tuning slope can be as high as 1000s of ppm/V as the gap size is reduced. In other words, the tuning characteristics improve (e.g., increase) as the gap is reduced.

Figure 7:
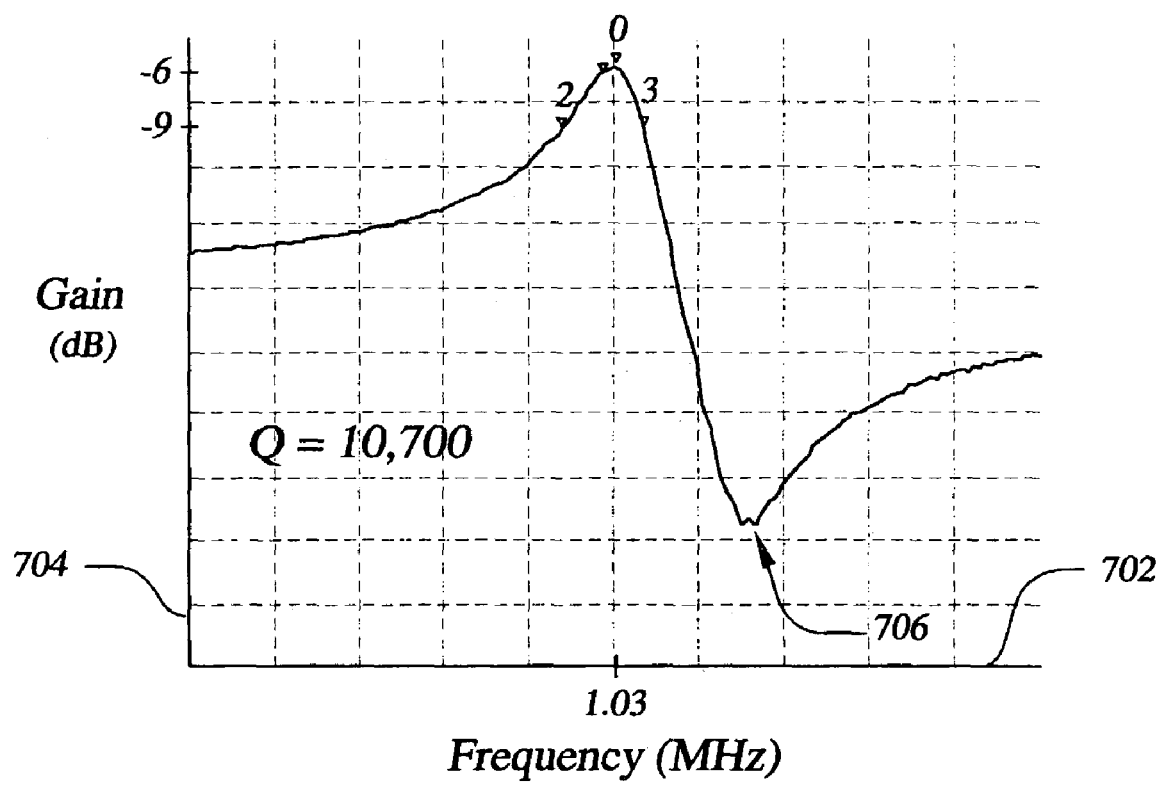
FIG. 7 shows the measured resonance peak for a third flexural mode for a clamped-clamped capacitive beam resonator embodiment.
Figure 8:
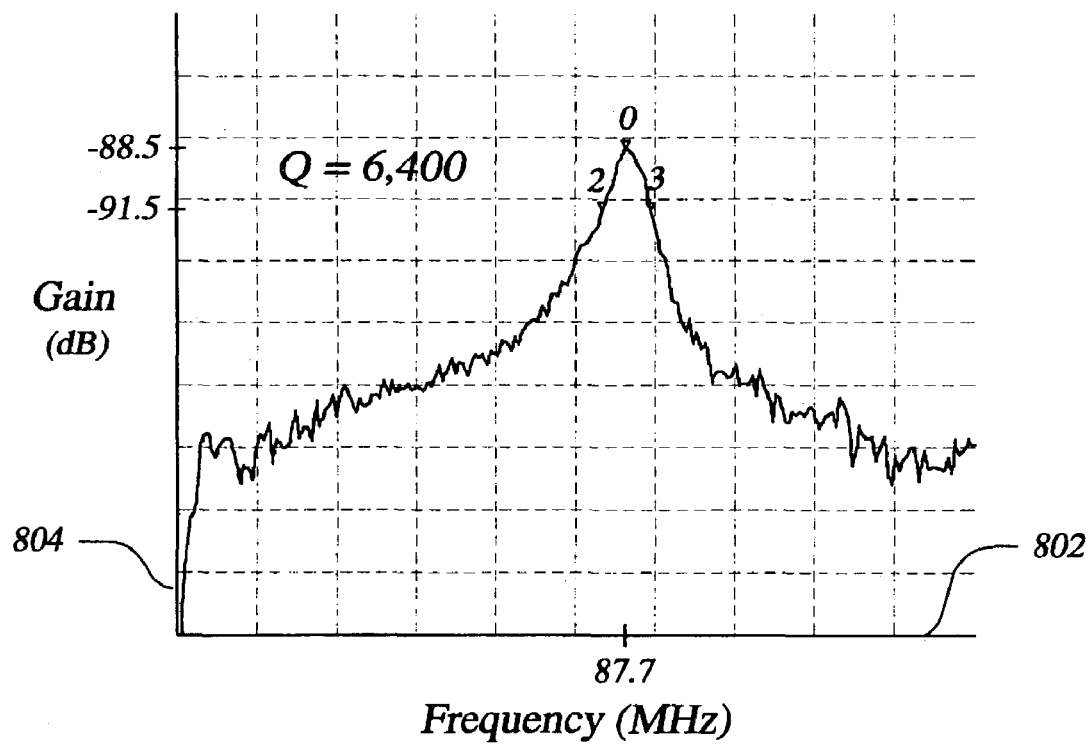
FIG. 8 shows a frequency response of a disk resonator embodiment having four supports at its four resonance nodes.
Figure 9:
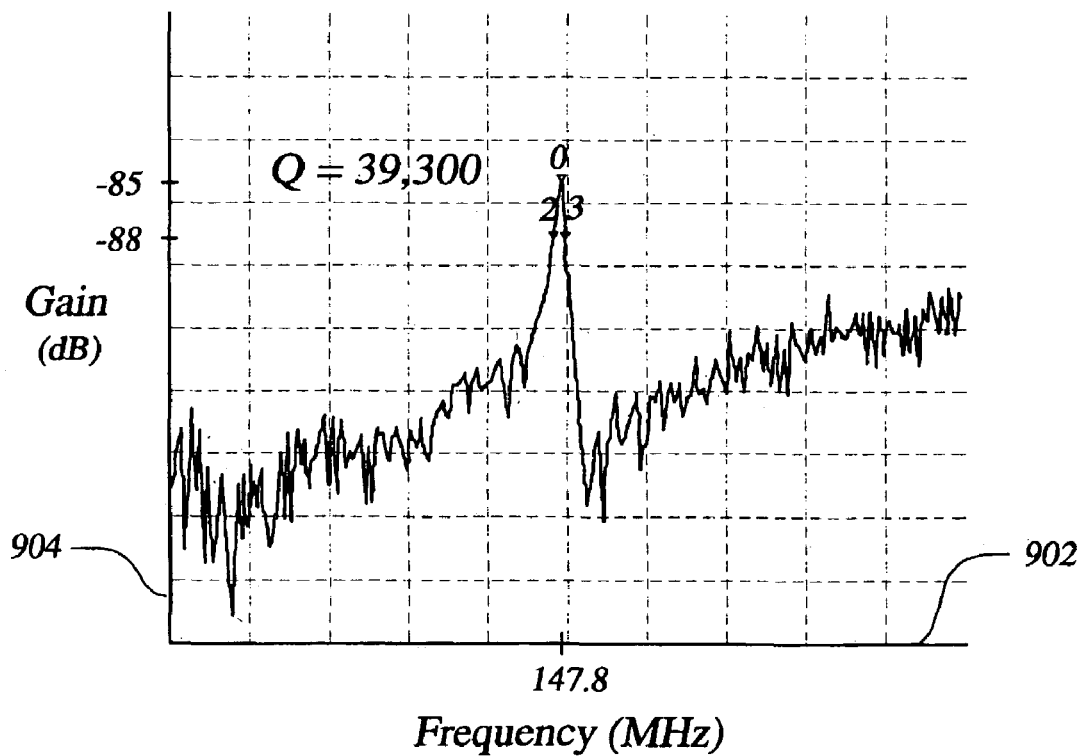
FIG. 9 shows a frequency response of a disk resonator embodiment having one support at its resonance node.

To achieve higher operating frequencies, a few of the tested clamped-clamped beam resonators were actuated in their third flexural mode and the quality factors were measured. FIGS. 7–9 provide plots of the frequency response of resonators of the preferred embodiments. One testing method includes applying an alternating current (AC) input voltage to an input of the resonator. Then, the output voltage and input voltage is monitored, and the ratio of output voltage to input voltage is plotted (e.g., in units of dB in the vertical axis). After sweeping the frequency over a specified range of frequencies (e.g., the horizontal axis of the following plots), the response of the resonator is manifested as a peak value at the resonant frequency of the tested resonator. The quality factor is measured as the ratio of the peak resonant frequency to the −3 dB bandwidth of the peak. The response of the resonators of the preferred embodiments include at least two modes: flexural and bulk modes. Flexural modes are usually referred to as the bending modes of high-aspect ratio beam resonators. The bulk modes are those bending modes common to low-aspect ratio disk and block resonators. FIG. 7 shows the measured resonance peak for the third flexural mode for a clamped-clamped SCS capacitive beam resonator at 1 MHz. Axis 702 provides for frequency in MHz, and axis 704 provides for the transmission gain (in dB), from which the quality factor is derived. A quality factor of 10,700 was measured at 1.03 MHz for the third resonance mode of a 510 μm long, 5.5 μm wide SCS beam resonator (the $1^{st}$ mode is at 165 kHz). The anti-resonance peak 706 is due to the parasitic feedthrough capacitance. Table 2 below provides a summary of the Q measurement results for the $3^{rd}$ mode of capacitive beam resonators with other dimensions.

TABLE 2

| W (μm) | L (μm) | $F_0$-$1^{st}$ (kHz) | $F_0$-$3^{rd}$ (MHZ) | Q ($3^{rd}$ Mode) |
|---|---|---|---|---|
| 7.5 | 900 | 74.8 | 0.44 | 10400 |
| 7.5 | 700 | 125.5 | 0.74 | 8000 |
| 6.5 | 510 | 198.0 | 1.21 | 8300 |

Thus, using the all-silicon CRF methods of the preferred embodiments, uniform capacitive gaps of 0.7 μm are achievable and have been demonstrated. Quality factors (Q) as high as 67,000 for the $1^{st}$ mode at 40 kHz, and 11,000 for the $3^{rd}$ mode at 1 MHz have been measured for clamped-clamped SCS beam resonators.

As indicated above, the CRF methods of the preferred embodiments can be used to create ultra-stiff SCS resonators that can be thin or thick, with sub-100 nm capacitive gaps. The following description will focus on performance characteristics of capacitive beam resonators fabricated using the SOI-based CRF methods.

A number of single crystal silicon clamped-clamped beam and side-supported disk resonators with different number of support beams, various dimensions and various thicknesses were fabricated and tested under vacuum in a two-port configuration, similar to the test set-up described in association with the silicon-only test set-up. FIG. 8 shows the frequency response and quality factor for one disk embodiment. Axis 802 provides for the frequency in MHz, and axis 804 provides for the transmission gain (in dB). The particular disk embodiment represented by FIG. 8 was a 50 µm in diameter, 3 µm thick disk resonator, with four supports at its four resonance nodes (0.7 µm wide and 2.7 µm long), showing a Q of approximately 6,400 at its first flexural resonance mode with a frequency of 87.7 MHz.

FIG. 9 illustrates the frequency response and quality factor for another disk embodiment. Axis 902 and 904 provide for frequency (MHz) and transmission gain (dB), respectively. The disk embodiment represented in FIG. 9 was a 30 µm in diameter, 3 µm thick disk resonator, supported by a 1.7 µm wide, 2.7 µm long support at only one resonance node. A quality factor of approximately 39,300 has been measured in vacuum for the first flexural mode of this resonator at the frequency of approximately 148 MHz.

To reduce the support loss of the side supported disks, the supports are placed at the resonance nodes (45 degrees away from the center of the electrodes). By comparing the measured Q values of the two disk resonators with different number of support beams, it is apparent that mechanical support is the major source of loss in this type of resonator. The support loss of the side supported disk resonators can be minimized by reducing the number of supports and optimizing the dimensions of the supporting elements. Thus, the quality factor is limited by the support loss which is related to mechanical design. The CRF methods of the preferred embodiments can create very high Q resonators.

Unlike lower frequency beam resonators, the Q of ultra-stiff high frequency resonators (i.e. disks) is much less susceptible to the pressure of the surrounding environment. For example, the 30 µm disk resonator was also operated in atmospheric pressure and demonstrated a quality factor of 8,200 (not shown).

A number of SCS clamped-clamped beam resonators with frequencies in the HF band were also fabricated using the SOI-based CRF methods of the preferred embodiments. Beam resonators were operated in their first and higher flexural modes in order to achieve higher resonance frequencies without reducing the aspect-ratio and introducing excessive support loss. A quality factor of 1,800 was measured at the resonance frequency of 9.8 MHz for a 50 µm long, 3.5 µm wide clamped-clamped beam resonator. The same resonator was operated in its third resonance mode at 45 MHz and showed a Q of 900. Another clamped-clamped beam resonator embodiment, having dimensions 50 µm long, 2 µm wide operating in its third flexural mode, showed a Q of 3,900 at the resonance frequency of 37 MHz.

High frequency (HF and VHF) single crystal silicon capacitive microresonators with polysilicon electrodes and 90 nm inter-electrode gap spacing have been implemented on SOI substrates using the SOI-based CRF methods. Much higher quality factors were achieved using ultra-stiff disk resonators in the VHF band comparing to the beam resonators.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A method for fabricating micro-electro-mechanical system (MEMS) capacitive resonators, the method comprising:
   forming trenches in a semiconductor-on-insulator substrate;
   conformally coating sidewalls of the trenches with an oxide;
   filling the coated trenches with polysilicon, wherein electrodes are derived from the polysilicon;
   forming release openings and removing the polysilicon and at least a portion of the semiconductor-on-silicon substrate; and
   removing the conformally coated oxide and an oxide of the semiconductor-on-insulator substrate, wherein a capacitive gap is formed, wherein a resonating element of one of the capacitive resonators is released.

2. The method of claim 1, further including:
   growing and patterning an insulator oxide, wherein the insulator oxide provides isolation between the semiconductor-on-insulator substrate and wire-bonding pads;
   depositing and patterning nitride, wherein the nitride provides protection for the insulator oxide disposed on the pads;
   growing and removing a surface treatment oxide, wherein the surface treatment oxide enables the reduction of the roughness of sidewalls of the resonating element;
   depositing polysilicon to form the wirebonding pads for drive and sense electrodes;
   metallizing the pads; and
   wherein removing the polysilicon includes patterning the polysilicon inside the trenches.

3. The method of claim 1, wherein the forming release openings comprises anisotropically etching to an oxide layer of the semiconductor-on-insulator substrate, such that the undercut of the resonating element is facilitated.

4. The method of claim 1, wherein the filling includes one of filling the trenches with doped LPCVD polysilicon such that the electrodes are formed vertically and depositing and patterning doped LPCVD polysilicon.

5. The method of claim 1, wherein the forming trenches includes one of deep reactive ion etching and regular reactive ion etching to an oxide layer of the semiconductor-on-insulator substrate.

6. The method of claim 1, wherein the conformally coating includes depositing a LPCVD high-temperature oxide of approximately less than 100 nanometers.

7. The method of claim 1, wherein the conformally coating is scalable to correspond to a desired thickness of a lateral gap spacing for the capacitive resonator.

8. The method of claim 1, wherein the removing comprises an anisotropic plasma etching such that at least a portion of the oxide remains on sidewalls of the resonating element.

9. The method of claim 1, wherein the releasing comprises exposing the semiconductor-on-insulator substrate to a solution comprising HF:H20 to release the resonating element from a handle layer and the electrodes.

10. The method of claim 1, wherein the forming trenches includes etching high-aspect ratio trenches.

11. The method of claim 1, wherein the removing includes forming a gap between the resonating element and the polysilicon in a self-aligned manner.

12. The method of claim 1, wherein the removing is performed to form a plurality of capacitive gaps and release a plurality of resonating elements, each of the plurality of resonating elements electrically isolated from each other.

13. The method of claim 1, further including conformally coating surfaces of the semiconductor-on-insulator substrate with the oxide associated with conformal coating.

14. A method for fabricating micro-electro-mechanical system (MEMS) capacitive resonators, the method comprising:
forming trenches in a semiconductor-on-insulator substrate;
conformally coating the sidewalls of the trenches with an oxide;
filling the coated trenches with polysilicon, wherein electrodes are derived from the polysilicon;
forming release openings and removing the polysilicon and at least a portion of the semiconductor-on-silicon substrate without isotropic etching of the polysilicon or semiconductor portion of the semiconductor-on-silicon substrate; and
removing the conformally coated oxide and an oxide of the semiconductor-on-insulator substrate, wherein a capacitive gap is formed, wherein a resonating element of one of the capacitive resonators is released.

15. The method of claim 14, further including:
growing and patterning an insulator oxide, wherein the insulator oxide provides isolation between the semiconductor-on-insulator substrate and wire-bonding pads;
depositing and patterning nitride, wherein the nitride provides protection for the insulator oxide disposed on the pads;
growing and removing a surface treatment oxide, wherein the surface treatment oxide enables the reduction of the roughness of sidewalls of the resonating element;
depositing polysilicon to form the wirebonding pads for drive and sense electrodes;
metallizing the pads; and
wherein removing the polysilicon includes patterning the polysilicon inside the trenches.

16. The method of claim 14, wherein the forming release openings comprises anisotropically etching to an oxide layer of the semiconductor-on-insulator substrate; such that the undercut of the resonating element is facilitated.

17. The method of claim 14, wherein the filling includes one of filling the trenches with doped LPCVD polysilicon such that the electrodes are formed vertically and depositing and patterning doped LPCVD polysilicon.

18. The method of claim 14, wherein the forming trenches includes one of deep reactive ion etching and regular reactive ion etching to an oxide layer of the semiconductor-on-insulator substrate.

19. The method of claim 14, wherein the conformally coating includes depositing a LPCVD high-temperature oxide of approximately less than 100 nanometers.

20. The method of claim 14, wherein the conformally coating is scalable to correspond to a desired thickness of a lateral gap spacing for the capacitive resonator.

21. The method of claim 14, wherein the removing comprises an anisotropic plasma etching such that at least a portion of the oxide remains on sidewalls of the resonating element.

22. The method of claim 14, wherein the releasing comprises exposing the semiconductor-on-insulator substrate to a solution comprising HF:H20 to release the resonating element from a handle layer and the electrodes.

23. The method of claim 14, wherein the forming trenches includes etching high-aspect ratio trenches.

24. The method of claim 14, further including conformally coating surfaces of the semiconductor-on-insulator substrate with the oxide associated with conformal coating.

25. A method for fabricating micro-electro-mechanical system (MEMS) capacitive resonators having sharply defined boundaries, the method consisting of:
growing or depositing an oxide layer on a semiconductor-on-insulator substrate and patterning the oxide to the shape of the resonators;
forming trenches in the semiconductor-on-insulator substrate by using the oxide layer as a mask;
conformally coating sidewalls of the trenches with an oxide;
filling the coated trenches with polysilicon, wherein electrodes are derived from the polysilicon;
forming release openings and removing the polysilicon and at least a portion of the semiconductor-on-silicon substrate without isotropic etching of the polysilicon or semiconductor portion of the semiconductor-on-silicon substrate; and
forming a resonating element having sharply defined boundaries of one of the capacitive resonators by removing the conformally coated oxide and an oxide of the semiconductor-on-insulator substrate, wherein a capacitive gap is formed, wherein the resonating element is released.

26. A method for fabricating micro-electro-mechanical system (MEMS) capacitive resonators having a height-to-width ratio of less than one, the method comprising:
forming trenches in a semiconductor-on-insulator substrate;
conformally coating sidewalls of the trenches with an oxide;
filling the coated trenches with polysilicon, wherein electrodes are derived from the polysilicon;
forming release openings and removing the polysilicon and at least a portion of the semiconductor-on-silicon substrate without isotropic etching of the polysilicon or semiconductor portion of the semiconductor-on-silicon substrate; and
forming a resonating element having a height-to-width ratio of less than one of the capacitive resonators by removing the conformally coated oxide and an oxide of the semiconductor-on-insulator substrate, wherein a capacitive gap is formed, wherein the resonating element is released.

27. The method of claim 26, further including:
growing and patterning an insulator oxide, wherein the insulator oxide provides isolation between the semiconductor-on-insulator substrate and wire-bonding pads;
depositing and patterning nitride, wherein the nitride provides protection for the insulator oxide disposed on the pads;
growing and removing a surface treatment oxide, wherein the surface treatment oxide enables the reduction of the roughness of sidewalls of the resonating element;
depositing polysilicon to form the wirebonding pads for drive and sense electrodes;
metallizing the pads; and
wherein removing the polysilicon includes patterning the polysilicon inside the trenches.

28. The method of claim 26, wherein the forming release openings comprises anisotropically etching to an oxide layer of the semiconductor-on-substrate, such that the undercut of the resonating element is facilitated.

29. The method of claim 26, wherein the filling includes one of filling the trenches with doped LPCVD polysilicon such that the electrodes are formed vertically and depositing and patterning doped LPCVD polysilicon.

30. The method of claim 26, wherein the forming trenches includes one of deep reactive ion etching and regular reactive ion etching to an oxide layer of the semiconductor-on-insulator substrate.

31. The method of claim 26, wherein the conformally coating includes depositing a LPCVD high-temperature oxide of approximately less than 100 nanometers.

32. The method of claim 26, wherein the conformally coating is scalable to correspond to a desired thickness of a lateral gap spacing for the capacitive resonator.

33. The method of claim 26, wherein the removing comprises an anisotropic plasma etching such that at least a portion of the oxide remains on sidewalls of the resonating element.

34. The method of claim 26, wherein the releasing comprises exposing the semiconductor-on-insulator substrate to a solution comprising HF:H20 to release the resonating element from a handle layer and the electrodes.

35. the method of claim 26, further comprising conformally coating surfaces of the semiconductor-on-insulator substrate with the oxide associated with conformal coating.

* * * * *

UNITED STATES PATENT AND TRADEMARK OFFICE
CERTIFICATE OF CORRECTION

PATENT NO. : 7,023,065 B2
APPLICATION NO. : 10/632176
DATED : April 4, 2006
INVENTOR(S) : Ayazi et al.

It is certified that error appears in the above-identified patent and that said Letters Patent is hereby corrected as shown below:

*In column 10, line 2, change "602" to --650--.*

*In column 10, line 3, change "604" to --652--.*

*In column 10, line 7, add --by line 654-- after "shown".*

*In claim 14, line 13, after the word "coating" remove "the".*

*In claim 16, line 44, after the word "substrate" remove ";" and change to --,--.*

*In claim 28, line 3, after the word "the" remove "semiconductor-on-substrate" and change to --semiconductor-on-insulator substrate--.*

Signed and Sealed this

Thirteenth Day of March, 2007

JON W. DUDAS
*Director of the United States Patent and Trademark Office*